United States Patent
Matsumoto et al.

(10) Patent No.: US 7,205,767 B2
(45) Date of Patent: Apr. 17, 2007

(54) MAGNETIC APPARATUS, INSTALLATION METHOD FOR MAGNETIC APPARATUS, AND MAGNETIC RESONANCE IMAGING DIAGNOSIS SYSTEM

(75) Inventors: Takahiro Matsumoto, Tokyo (JP); Seijirou Itou, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 44 days.

(21) Appl. No.: 11/125,161

(22) Filed: May 10, 2005

(65) Prior Publication Data

US 2006/0103384 A1    May 18, 2006

(30) Foreign Application Priority Data

Nov. 18, 2004   (JP)   ............... 2004-334280

(51) Int. Cl.
*G01V 3/00*   (2006.01)
(52) U.S. Cl. ....................... 324/320; 324/319
(58) Field of Classification Search ................ 324/320, 324/319, 318
See application file for complete search history.

(56) References Cited

U.S. PATENT DOCUMENTS

| | | | |
|---|---|---|---|
| 6,043,653 A | | 3/2000 | Takamori et al. |
| 6,404,200 B1 * | | 6/2002 | Dietz et al. ................. 324/318 |
| 6,597,174 B2 * | | 7/2003 | Arz ............................. 324/318 |
| 6,894,498 B2 * | | 5/2005 | Edelstein .................... 324/318 |
| 7,034,537 B2 * | | 4/2006 | Tsuda et al. ................ 324/320 |
| 2004/0251901 A1 | | 12/2004 | Tsuda et al. |

FOREIGN PATENT DOCUMENTS

| | | |
|---|---|---|
| JP | 10-118043 | 5/1998 |
| JP | 2002-017705 | 1/2002 |
| JP | 2002-52004 | 2/2002 |

* cited by examiner

*Primary Examiner*—Louis M. Arana
(74) *Attorney, Agent, or Firm*—Buchanan Ingersoll & Rooney PC (57) ABSTRACT

The present invention has been made in order to decrease vibrations of gradient-magnetic-field coils in a magnetic apparatus for a magnetic resonance imaging diagnosis system so as to improve the image quality of magnetic resonance images.

The magnetic apparatus includes: a superconductive electromagnet having pairs of superconductive coils for generating a uniform static magnetic field region, a pair of vacuum containers each for housing one of the superconductive coils of each of the pairs thereof, and a vacuum container connecting member for connecting the pair of vacuum containers; and a pair of gradient-magnetic-field coils for generating a gradient magnetic field having a gradient in a uniform static magnetic field region. In the magnetic apparatus, the pair of gradient-magnetic-field coils is connected by gradient-magnetic-field-coil-connecting members, and supporting members, which are connected either to the gradient-magnetic-field-coil-connecting members or to one of the gradient-magnetic-field coils, can be fixed to an installation base for the superconductive electromagnet.

17 Claims, 7 Drawing Sheets

MAGNETIC APPARATUS, INSTALLATION METHOD FOR MAGNETIC APPARATUS, AND MAGNETIC RESONANCE IMAGING DIAGNOSIS SYSTEM

BACKGROUND OF THE INVENTION

1. Field of the Invention

The present invention belongs to a technological field of a magnetic resonance imaging diagnosis system (MRI system), and relates to a magnetic apparatus having a superconductive electromagnet for generating a uniform static magnetic field and gradient-magnetic-field coils for generating a gradient magnetic field.

The MRI system is an imaging diagnosis system utilizing a nuclear magnetic resonance phenomenon in materials, which enables imaging ingredients or structures of a subject body laid under a uniform static magnetic field region generated by the superconductive electromagnet, etc.

The MRI system comprises: a superconductive electromagnet for generating a uniform static magnetic field region; a pair of gradient-magnetic-field coils and a gradient-magnetic-field power supply for generating a gradient magnetic field having gradients in the three directions "X", "Y", and "Z" (given the Z directions to be the uniform static magnetic field) in the uniform static magnetic field region; a high-frequency coils and a high-frequency-magnetic field generator for emitting high-frequency waves to a subject laid in the uniform static magnetic field region and receiving a nuclear magnetic resonance signal from the subject; and a computer for digitizing the received nuclear magnetic resonance signal by the high-frequency coils so as to execute an imaging process.

2. Description of the Related Art

In a first conventional MRI system (for example, refer to Japanese Laid-Open Patent Publications 2002-17705), a vacuum container for housing superconductive coils is in annular form, and gradient-magnetic-field coils are located in the central space of the vacuum container and fixed to an iron yoke via a gradient-magnetic-field-supporting member.

Moreover, in a second conventional MRI system (for example, refer to Japanese Laid-Open Patent Publications 2002-52004), a vacuum container for housing superconductive coils is in annular form, and gradient-magnetic-field coils are located in the central space of the vacuum container and fixed to a flat-plate-gradient-magnetic-field-coil-supporting member via a cylindrical gradient-magnetic-field-coil-supporting member. The flat-plate-gradient-magnetic-field-coil-supporting member is maintained apart from the vacuum container by being coupled with a fixed pillar.

SUMMARY OF THE INVENTION

When a gradient magnetic field is generated, a pulsed current, which is extended to a few hundred amperes, is passed through gradient-magnetic-field coils. In this case, an electromagnetic force, which is extended to a few hundred kgf through 1000 kgf, is applied between the upper and lower gradient-magnetic-field coils from upper/lower/left/right directions. Thereby, the gradient-magnetic-field coils are intensely vibrated.

In a conventional art, because each of the upper/lower gradient-magnetic-field coils is supported by different supporting members, if the upper/lower gradient-magnetic-field coils vibrate in quite a different way from each other, the symmetry of the vibrations sometimes has not been ensured. In this case, there have been problems in that the image quality of magnetic resonance images is deteriorated in a high-speed continuous shot, because the vibration of the gradient-magnetic-field coils are transmitted to the superconductive coils, resultantly magnetic field intensity in the uniform static magnetic field varies by a few ppm.

The present invention, which has been made in order to solve the above described problems, provides an MRI system that can decrease the vibrations of the gradient-magnetic-field coils so as to improve the image quality of magnetic resonance images.

A magnetic apparatus related to the present invention comprises: a superconductive electromagnet including pairs of superconductive coils for generating a uniform static magnetic field, a pair of vacuum containers each for housing one of the superconductive coils of each of the pairs thereof, and a vacuum-container-connecting member for connecting the pair of vacuum containers; a pair of gradient-magnetic-field coils for generating a gradient magnetic field having a gradient in a uniform static magnetic field region; a gradient-magnetic-field-coil-connecting member for connecting the pair of gradient-magnetic-field coils; and a supporting member connected either to the gradient-magnetic-field-coil-connecting member, or to one of the gradient-magnetic-field coils, wherein the supporting member can be fixed to an installation base for the superconductive electromagnet.

The present invention, by combining the pair of gradient-magnetic-field coils, enables an electromagnet force interacting between the gradient-magnetic-field coils to be offset. Therefore, the vibrations of the gradient-magnetic-field coils are decreased, so that the vibrations transmitted to the superconductive coils are also decreased. As a result, the magnetic field-intensity fluctuation of the uniform static magnetic field generated by the superconductive coils can be suppressed, and image quality of magnetic resonance images can be raised accordingly.

DETAILED DESCRIPTION OF THE PREFERRED EMBODIMENTS

Embodiment 1

Figure 1:
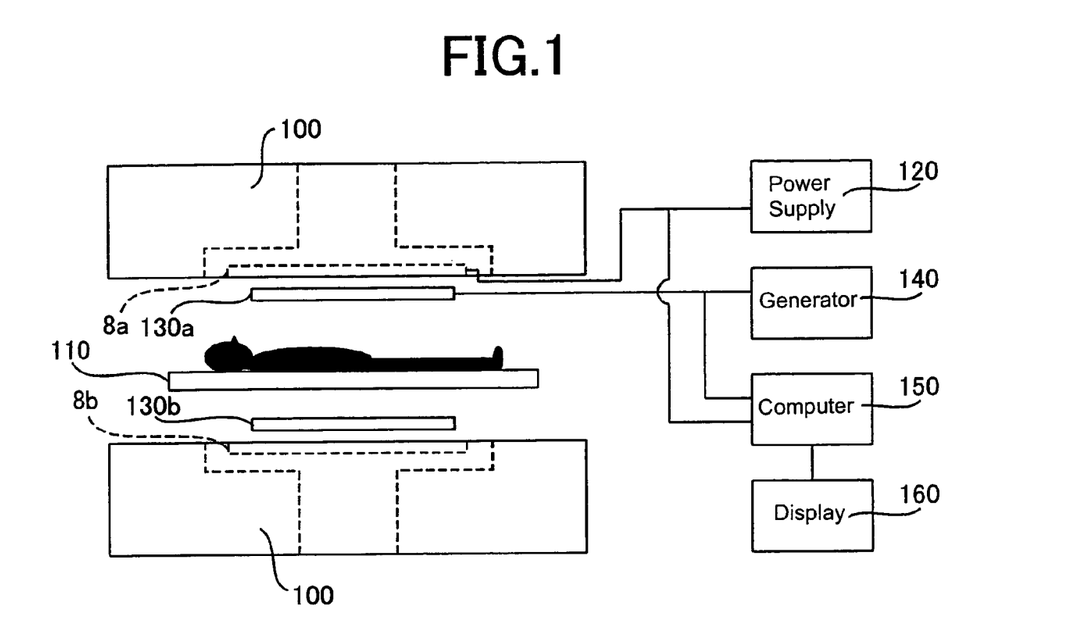
FIG. 1 is a schematic structure of a MRI system for explaining Embodiment 1.

FIG. 1 is a schematic structure for explaining Embodiment 1 related to an MRI system to which the present invention is applied. As illustrated in FIG. 1, the MRI system comprises: a bed "110" for a subject to lie down on; a superconductive electromagnet "100" for generating a uniform static magnetic field that is emitted to the subject; gradient-magnetic-field coils "8a" and "8b" and a gradient-magnetic-field power supply "120" for a generating gradient magnetic field having a gradient in the uniform static magnetic field region; high-frequency coils "130a" and "130b" and a high-frequency-magnetic field generator "140" for emitting high-frequency magnetic field to the subject and receiving nuclear magnetic resonance signals from the subject; a computer "150" for executing an image-process from the received nuclear magnetic resonance signals; and a display unit "160" for displaying, as a tomographic image, image signals that have been image-processed by the computer 150.

Figure 2:
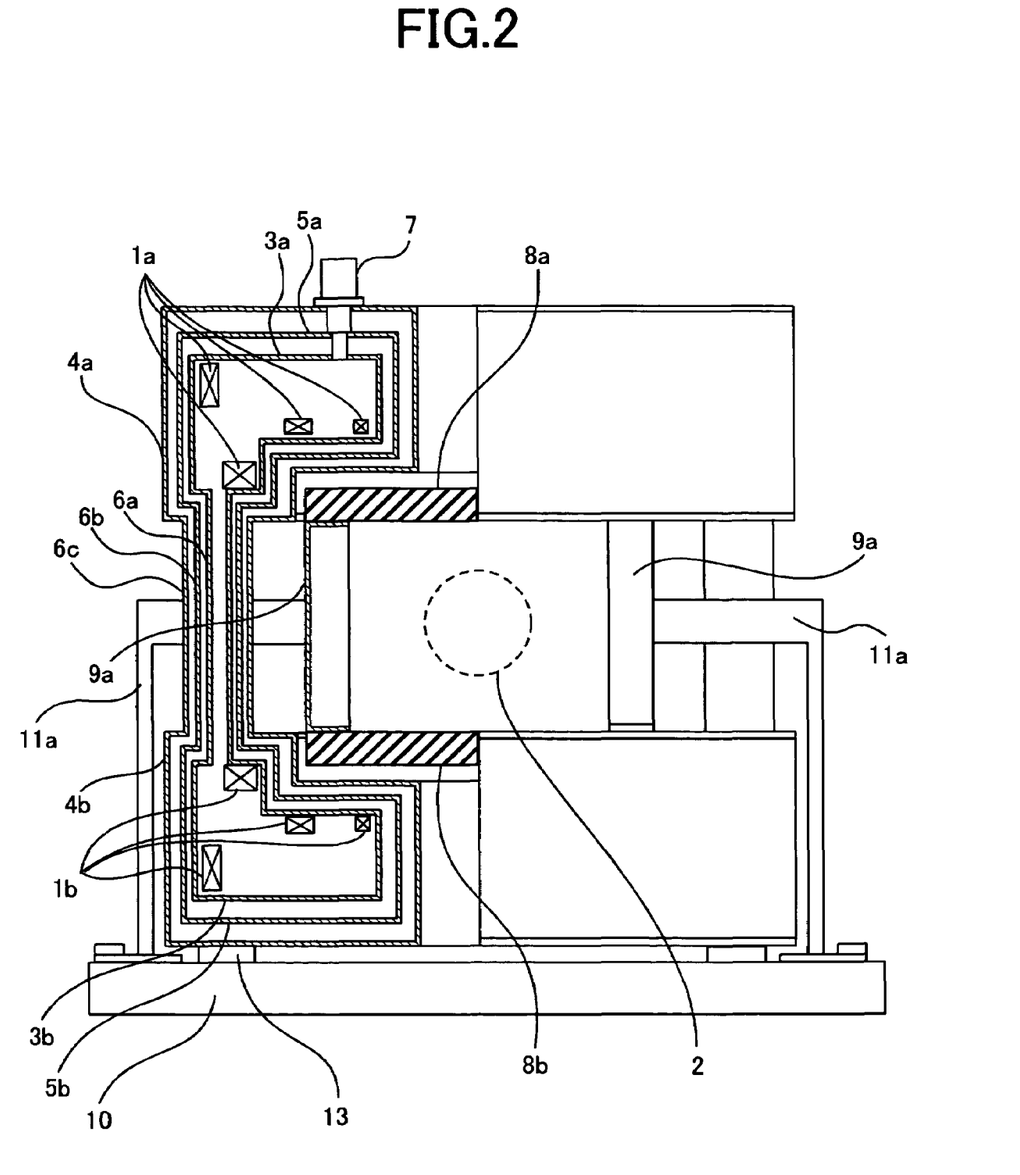
FIG. 2 is a partial cross-sectional view of a magnetic apparatus for explaining Embodiment 1.

FIG. 2 is a partial cross-sectional view of a magnetic apparatus in Embodiment 1. The left side of FIG. 2 is the cross-sectional view. The magnetic apparatus includes the superconductive electromagnet 100 and the pair of gradient-magnetic-field coils 8a and 8b. Here, magnetic apparatus is fixed to a base "10" with anchors "13".

Firstly, the superconductive electromagnet 100 will be explained. Each of a plurality of superconductive coils "1a" illustrated in the upper side of FIG. 2 makes a pair with the corresponding one of a plurality of superconductive coils "1b" illustrated in the lower side of FIG. 2 so as to generate a uniform static magnetic field of about 0.7 through 1 tesla. Particularly in a uniform static magnetic field region "2", uniformity of the uniform static magnetic field is required to be within a deviation of some few ppm. The subject is shot by the MRI system, by exposing a portion of the subject to be shot into the uniform static magnetic field region 2.

The upper superconductive coils are housed in an upper helium container "3a", and the lower superconductive coils are housed in a lower helium container "3b". Liquid helium, as a refrigerant, stored in the helium containers 3a and 3b refrigerates the superconductive coils 1a and 1b at an ultra cold temperature of 4.2 K, in which each coil comes into a superconductive state.

Moreover for vacuum heat insulation, the upper helium container 3a is housed in an upper vacuum container "4a", and the lower helium container 3a is housed in a lower vacuum container "4b". The vacuum containers 4a and 4b each are annularly shaped to face each other, having a hollow therethrough. An upper thermal shield "5a" is located between the helium container 3a and the vacuum container 4a, to shield radiated heat from the vacuum container 4a to the helium container 3a. In the same way, lower thermal shield "5b" is located between the helium container 3b and the vacuum container 4b, to shield radiated heat from the vacuum container 4b to the helium container 3b. The thermal shields 5a and 5b are composed of a material, such as aluminum, having high thermal conductivity. Moreover, multilayer heat insulators (not illustrated), in which aluminum deposited films and nets are alternately laminated in 20 through 40 layers, are located between the vacuum container 4a and the thermal shield 5a, and between the vacuum container 4b and the thermal shield 5b. Thereby, the amount of heat transmitted from each of the vacuum containers 4a and 4b to each of the helium containers 3a and 3b at an ultra cold temperature respectively can be decreased.

A pair of helium containers 3a and 3b is connected by a helium container connecting member "6a". The helium-container-connecting member 6a holds the containers against electromagnetic force that interacts between helium containers 3a and 3b, and also superconductive electric cables (not illustrated) for connecting the upper/lower superconductive coils are arranged inside the member. The pair of thermal shields 5a and 5b is connected by a thermal shield connecting member "6b". The thermal shield connecting member 6b transmits to the thermal shield 5a heat that has entered the thermal shield 5b, by connecting the upper/lower thermal shields 5a and 5b to each other. The pair of vacuum containers 4a and 4b is connected by a vacuum container connecting member "6c". The vacuum-container-connecting member 6c, which has a vacuum space inside, not only vacuum-insulates from heat the helium containers 3a and 3b, but also supports the containers against gravity that the vacuum containers 4a undergoes, and electromagnetic force interacting between the vacuum containers 4a and 4b. Moreover although the case is illustrated in FIG. 2, in which the numbers of the helium-container-connecting members 6a, the thermal shield connecting members 6b, and the vacuum container connecting members 6c each are two in both the left and right sides, the numbers and locations can be suitably selected.

The thermal shields 5a and 5b and the helium containers 3a and 3b are refrigerated by a combination of a refrigerator "7" and a compressor (not illustrated). In addition, although the case is illustrated in FIG. 2, in which the thermal shields 5a and 5b area single layered, the structure is not limited to this. Consumption of liquid helium is generally decreased to lower than 0.1 liter/hour by making the thermal shields 5a and 5b double layered, and by refrigerating, by means of the refrigerator 7, the thermal shield on the vacuum container side at about 70 K and the thermal shield on the helium container side at about 20 K. Moreover, consumption of liquid helium is decreased to almost 0 liter/hour by employing a refrigerator 7 that can refrigerate both the helium containers 3a and 3b to lower than 4.2 K. Next, the pair of gradient-magnetic-field coils 8a and 8b is explained. The gradient-magnetic-field coils 8a and 8b are located on the concave portions of the opposing faces of the vacuum container 4a and 4b, respectively, sandwiching the uniform static magnetic field region 2. The gradient-magnetic-field coils 8a and 8b generate a gradient magnetic field having gradients in the three directions "X", "Y", and "Z" in the uniform static magnetic field region 2.

The gradient-magnetic-field-coil-connecting member 9a is made of a high-intensity and nonmagnetic material, such as stainless steel having, for example, a length of 500 mm, and mechanically unites the gradient-magnetic-field coils 8a and 8b.

A supporting member "11a", which is connected to the central portion of the gradient-magnetic-field-coil-connecting member 9a, is fixed to the base 10, passing along the outside of the outmost edge of the vacuum container 4b. Here, the supporting member 11a is made of a material, such as stainless steel having a height of, for example, 1200 mm, enabling adjustments for height and location, and has a hook shape so as not to touch the vacuum container 4b. Moreover, fixtures, such as bolts, are provided on the illustrated lower side of the supporting member 11a so as to enable the member to be fixed to the base 10 on which the superconductive electromagnet 100 is fixed.

Thereby, the gradient-magnetic-field coils 8a and 8b are fixed to the base 10 via the gradient-magnetic-field-coil-connecting member 9a and the supporting member 11a. Moreover, although the case is illustrated in FIG. 2, in which the numbers of the gradient-magnetic-field-coil-connecting members 9a and the supporting members 11a each are two in the left and right sides, the numbers and locations can be suitably selected.

Next, those operations will be explained. The gradient-magnetic-field coils 8a and 8b generate a pulsed gradient-magnetic-field with an intensity of about 20 mT in the three directions X, Y, and Z in the uniform static magnetic field region 2. For example, in a case in which the magnetic field has a gradient in the same Z direction as the uniform static magnetic field, a repulsive force or an attractive force is generated between the gradient-magnetic-field coils 8a and 8b, because the gradient-magnetic-field coils each have a disc shape having a face perpendicular to the Z direction. Because the electromagnetic force becomes a few hundred kgf through 1000 kgf, the gradient-magnetic-field coils 8a and 8b violently vibrate.

Because the vibrating gradient-magnetic-field coils 8a and 8b are combined using a pair of left and right gradient-magnetic-field-coil-connecting members 9a in this Embodiment, an electromagnet force repulsively interacting between the gradient-magnetic-field coils 8a and 8b is offset by each other. Therefore, the vibrations of the gradient-magnetic-field coils 8a and 8b are decreased. Moreover, because the supporting member 11a is fixed to the base 10 that is actually deemed to be a static massive body, the vibrations transmitted to the superconductive coils 1a and 1b can be decreased.

Moreover, the electromagnetic forces interacting between the gradient-magnetic-field coils 8a and 8b are symmetrically generated in all directions, such as up/down, back/forth, and left/right directions, centering the uniform static magnetic field region 2. Therefore, although the gradient-magnetic-field coils 8a and 8b vibrate symmetrically in all directions, such as up/down, back/forth, and left/right directions, centering the uniform static magnetic field region 2, the vibrations are offset by each other, because the coils are combined by the gradient-magnetic-field-coil-connecting members 9a.

Furthermore, in FIG. 2, the central portion of the gradient-magnetic-field-coil-connecting members 9a is in the same height as the center of the uniform static magnetic field region 2. In other words, the supporting member 11a is connected to the central portion of the gradient-magnetic-field-coil-connecting members 9a, which is the vibrational neutral point of the of the gradient-magnetic-field coils 8a and 8b. Because the supporting member 11a is fixed to the vibrational neutral point where the vibrations are lowest, high material rigidity may not be required.

As described above, because the supporting member 11a is connected to the vibrational neutral point of the gradient-magnetic-field coils 8a and 8b, an electromagnet force repulsively interacting between the gradient-magnetic-field coils 8a and 8b can be effectively offset by each other, even if the supporting member 11a has low rigidity. Therefore, the vibrations of the gradient-magnetic-field coils 8a and 8b can be effectively decreased. As a result, the magnetic field intensity fluctuation of the uniform static magnetic field generated by the superconductive coils 1a and 1b can be suppressed, so that the image quality of magnetic resonance images can be raised accordingly.

Embodiment 2

Figure 3:
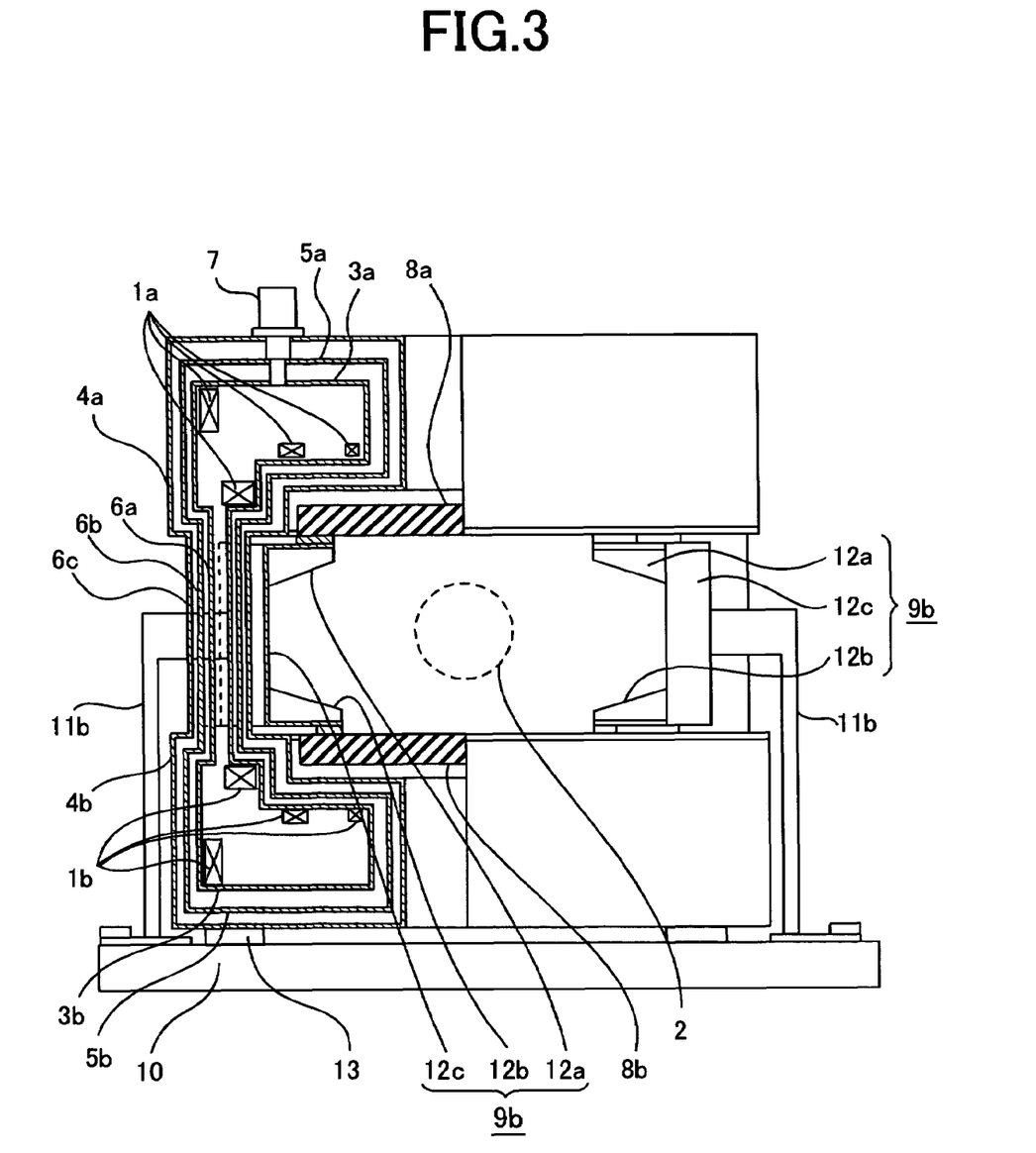
FIG. 3 is a partial cross-sectional view of a magnetic apparatus for explaining Embodiment 2.

FIG. 3 is a partial cross-sectional view of a magnetic apparatus, for explaining Embodiment 2. In this Embodiment, the configuration of the gradient-magnetic-field-coil-connecting member in Embodiment 1 has been modified. Modified portions will be explained.

The gradient-magnetic-field-coil-connecting member "9b" is composed of a pair of truss portions "12a" and "12b", and a pillar portion "12c". The upper truss portion 12a is composed of a contact region contacting to the inside of the outmost edge of the gradient-magnetic-field coil 8a and a non-contact region jutting out from the outmost edge of the gradient-magnetic-field coil 8a. In the same way, the lower truss portion 12b is composed of a contact region contacting to the inside of the outmost edge of the gradient-magnetic-field coil 8b and a non-contact region jutting out from the outmost edge of the gradient-magnetic-field coil 8b. The pillar portion 12c connects the non-contact regions of the pair of truss portions 12a and 12b with each-other.

By using the gradient-magnetic-field-coil-connecting member 9b as described above, the pillar portion 12c is jutted out from the outmost edge of the gradient-magnetic-field coils 8a and 8b. In other words, because the pillar portion 12c can be kept away from the uniform static magnetic field region 2, a space for laying a subject is expanded in left/right directions illustrated in FIG. 3, and the openness of the space is increased.

Moreover, a supporting member "11b", which is connected to the central portion of the pillar portion 12c of the gradient-magnetic-field-coil-connecting member 9b, is fixed to the base 10, passing along the outside of the outmost edge of the vacuum container 4b. Here, in FIG. 3, the central portion of the pillar portion 12c of the gradient-magnetic-field-coil-connecting members 9b is in the same height as the central position of the uniform static magnetic field region 2. In other words, the supporting member 11b is connected to the central portion, of the gradient-magnetic-field-coil-connecting members 9b, that is the vibrational neutral point of gradient-magnetic-field coils 8a and 8b.

As described above, because the supporting member 11b is connected to the vibrational neutral point of the gradient-magnetic-field coils 8a and 8b, an electromagnet force repulsively interacting between the vibrating gradient-magnetic-field coils 8a and 8b can be effectively offset by each other. Therefore, the vibrations of the gradient-magnetic-field coils 8a and 8b can be effectively reduced. As a result, the magnetic field-intensity fluctuation of the uniform static magnetic field generated by the superconductive coils 1a and 1b can be suppressed, so that the image quality of magnetic resonance images can be raised accordingly.

Embodiment 3

Figure 4:
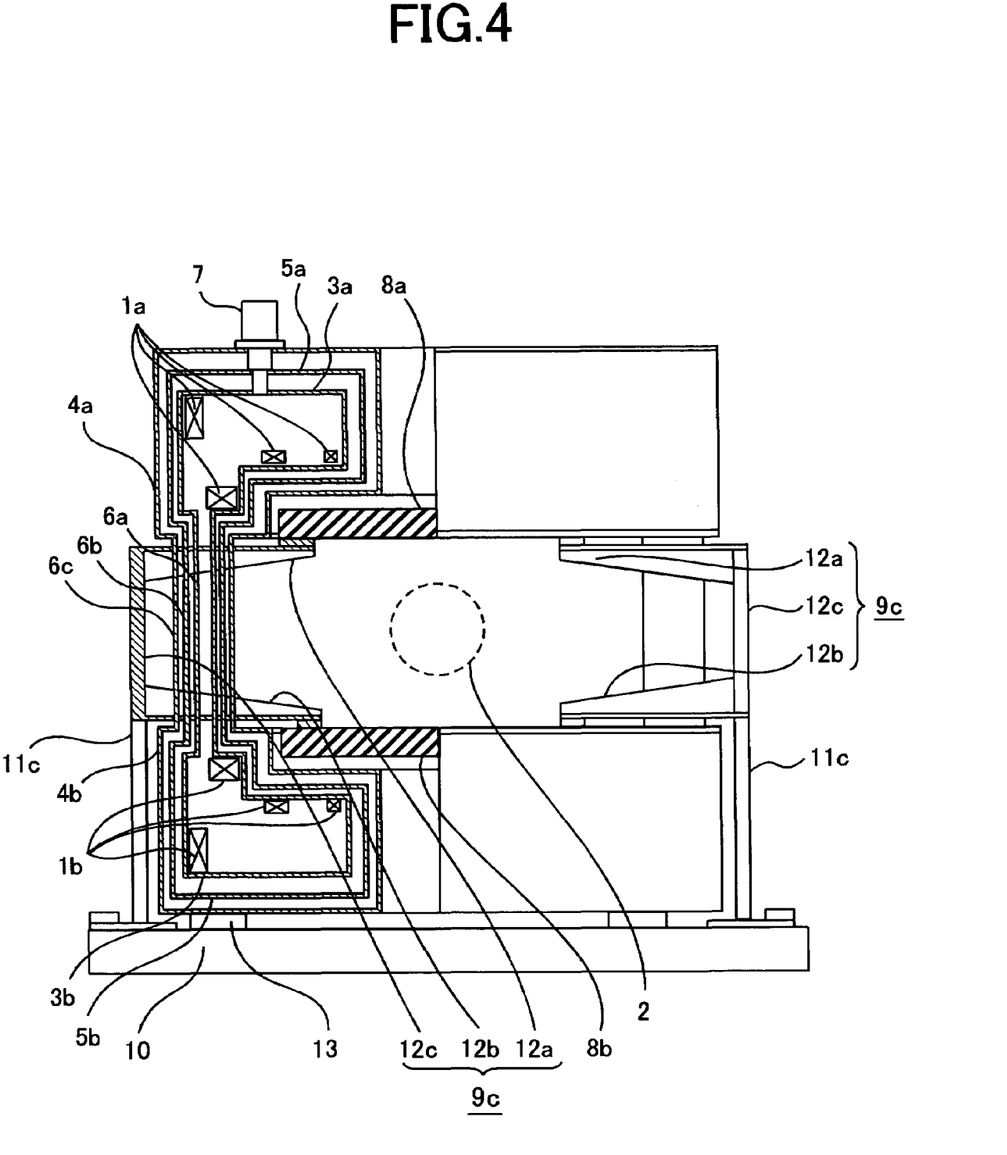
FIG. 4 is a partial cross-sectional view of a magnetic apparatus for explaining Embodiment 3.

FIG. 4 is a partial cross-sectional view of a magnetic apparatus, for explaining Embodiment 3. In this Embodiment, the configuration of the gradient-magnetic-field-coil-connecting member in Embodiment 1 has been modified. Modified portions will be explained.

The gradient-magnetic-field-coil-connecting member "9c" is composed of a pair of truss portions "12a" and "12b", and a pillar portion "12c". The upper truss portion 12a composed of a contact region contacting the inside of the outmost edge of the gradient-magnetic-field coil 8a and a non-contact region jutting out from the outmost edge of the gradient-magnetic-field coil 8a. In the same way, the lower truss portion 12b composed of a contact region contacting to the inside of the outmost edge of the gradient-magnetic-field coil 8b and a non-contact region jutting out from the outmost edge of the gradient-magnetic-field coil 8b. Here, the non-contact region of the truss portions 12a and 12b extends up to the outmost edge of the vacuum containers 4a and 4b. The pillar portion 12c connects the pair of truss portions 12a and 12b with each other. In FIG. 4, the pillar portion 12c connects the non-contact region of the truss portions 12a and 12b with each other, each of which juts out from the outmost edges of the vacuum containers 4a and 4b.

Moreover, a supporting member "11c" is connected to the lower truss portion 12b, and is disposed in collinear extension with the pillar portion 12c. In addition, the supporting member 11c and the pillar portion 12c may be made of a single unified member.

By using the gradient-magnetic-field-coil-connecting member 9c and the supporting member 11c as described above, the pillar portion 12c is jutted out from the outmost edges of the vacuum containers 4a and 4b. In other words, because the pillar portion 12c can be kept further away from the uniform static magnetic field region 2, a space for laying a subject is expanded in the left/right directions in FIG. 3, and the openness of the space is further increased.

Embodiment 4

Figure 5:
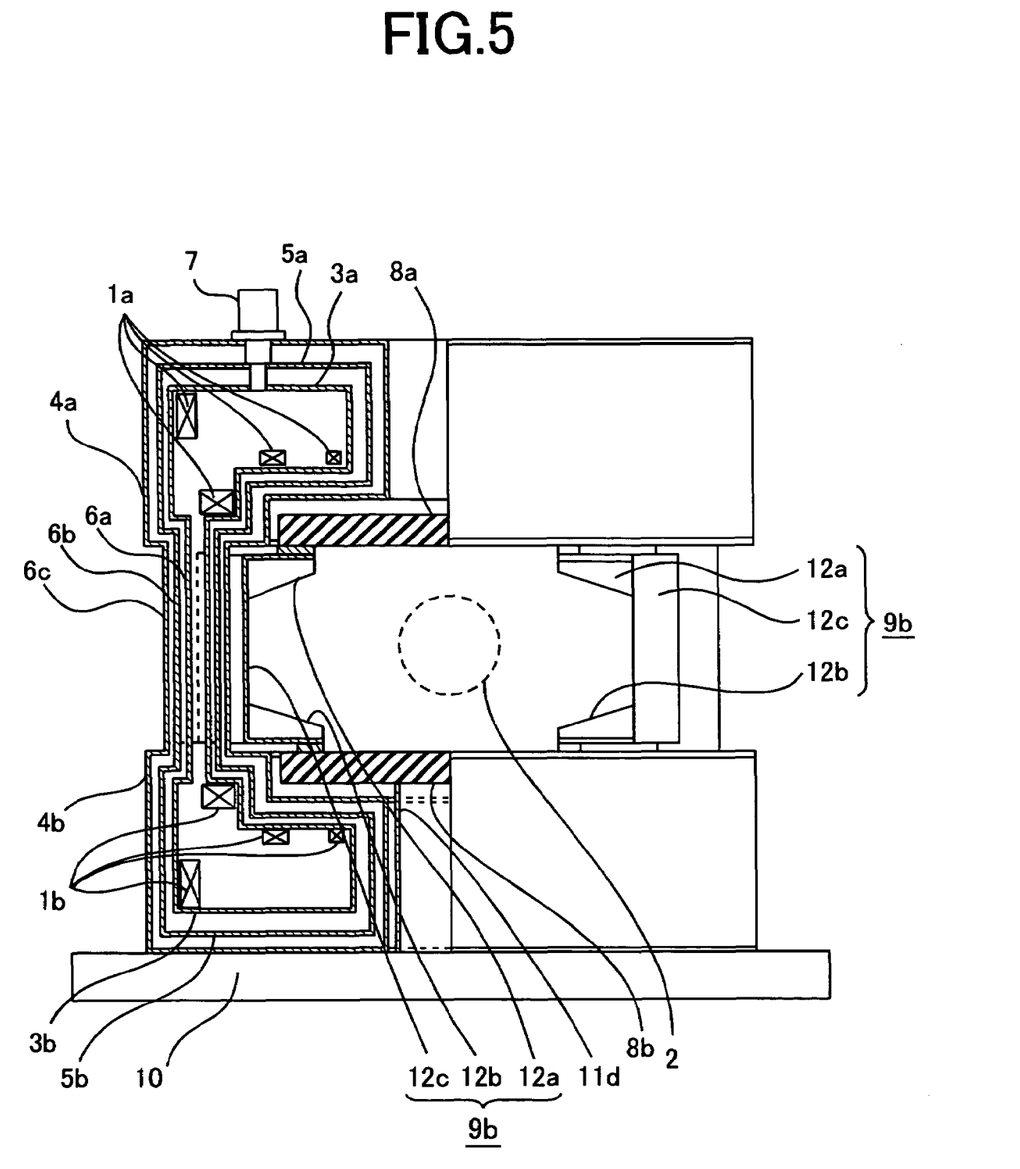
FIG. 5 is a partial cross-sectional view of a magnetic apparatus for explaining Embodiment 4.

FIG. 5 is a partial cross-sectional view of a magnetic apparatus, for explaining Embodiment 4. In this Embodiment, the configuration and disposal of the gradient-magnetic-field-coil-connecting member in Embodiment 2 has been modified. Here, although this Embodiment is explained as a modified example from Embodiment 2, it goes without saying that this configuration can be applied to other Embodiments. Modified portions will be explained.

A supporting member "11d", which is connected to the lower gradient-magnetic-field coil 8b, is fixed to the base 10, passing through the hollow of the vacuum container 4b neighboring the gradient-magnetic-field coil 8b. Here, the supporting member 11d is made in cylindrical shape so as not to contact the vacuum container 4b. Moreover, fixtures, such as bolts, are provided on the illustrated lower side of the supporting member 11a, enabling the supporting member to be connected to the base 10 on which the superconductive electromagnet 100 is fixed.

Because the vibrating gradient-magnetic-field coils 8a and 8b are combined by connecting the pair of left and right gradient-magnetic-field-coil-connecting members "9b" in this Embodiment, an electromagnet force repulsively interacting between the gradient-magnetic-field coils 8a and 8b is offset by each other. Therefore, the vibrations of the gradient-magnetic-field coils 8a 8b are decreased. Moreover, because the supporting member "11d" is fixed to the base 10 that is actually deemed to be a static massive body, the vibrations transmitted to the superconductive coils 1a and 1b are decreased. As a result, the magnetic field-intensity fluctuation of the uniform static magnetic field generated by the superconductive coils can be suppressed, so that the image quality of magnetic resonance images can be raised accordingly. Moreover, because the supporting member 11d is fixed to the base 10 through the hollow of the vacuum container 4b, the space for locating the magnet apparatus can be reduced. Furthermore, if the supporting member 11d is made in rotationally symmetry shape, such as in circular columnar or cylindrical shape, the rigidity of the member can be uniformized in back/forth and left/right directions.

Embodiment 5

Figure 6:
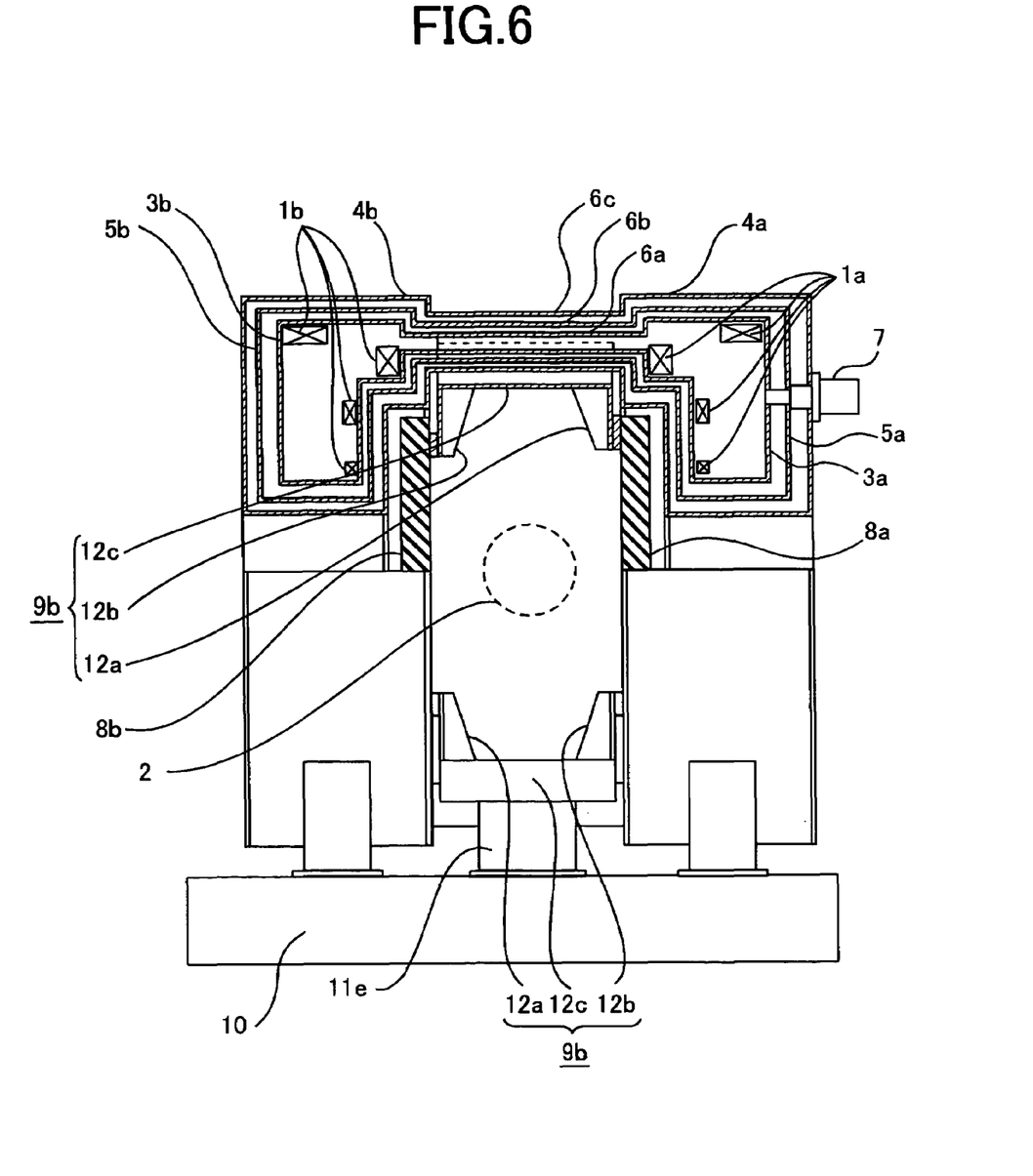
FIG. 6 is a partial cross-sectional view of a magnetic apparatus for explaining Embodiment 5.

FIG. 6 is a partial cross-sectional view of a magnetic apparatus, for explaining Embodiment 5. In this Embodiment, the magnet apparatus in Embodiment 2 is rotated 90 degrees, and the configuration and the position of the supporting member is modified. Here, although this Embodiment is explained as a modified example of Embodiment 2, the configuration and the position can be applied to other Embodiments. Modified portions will be explained.

By rotating the magnet apparatus, the direction of the uniform static magnet field is changed to a horizontal direction. Moreover, a supporting member "11e" is connected to the central portion of the gradient-magnetic-field-coil-connecting member "9b" and fixed to the base 10 just under the member. As described above, the present invention can be applied to the magnet apparatus for generating the uniform static magnetic field region 2 in the horizontal direction.

Embodiment 6

Figure 7:
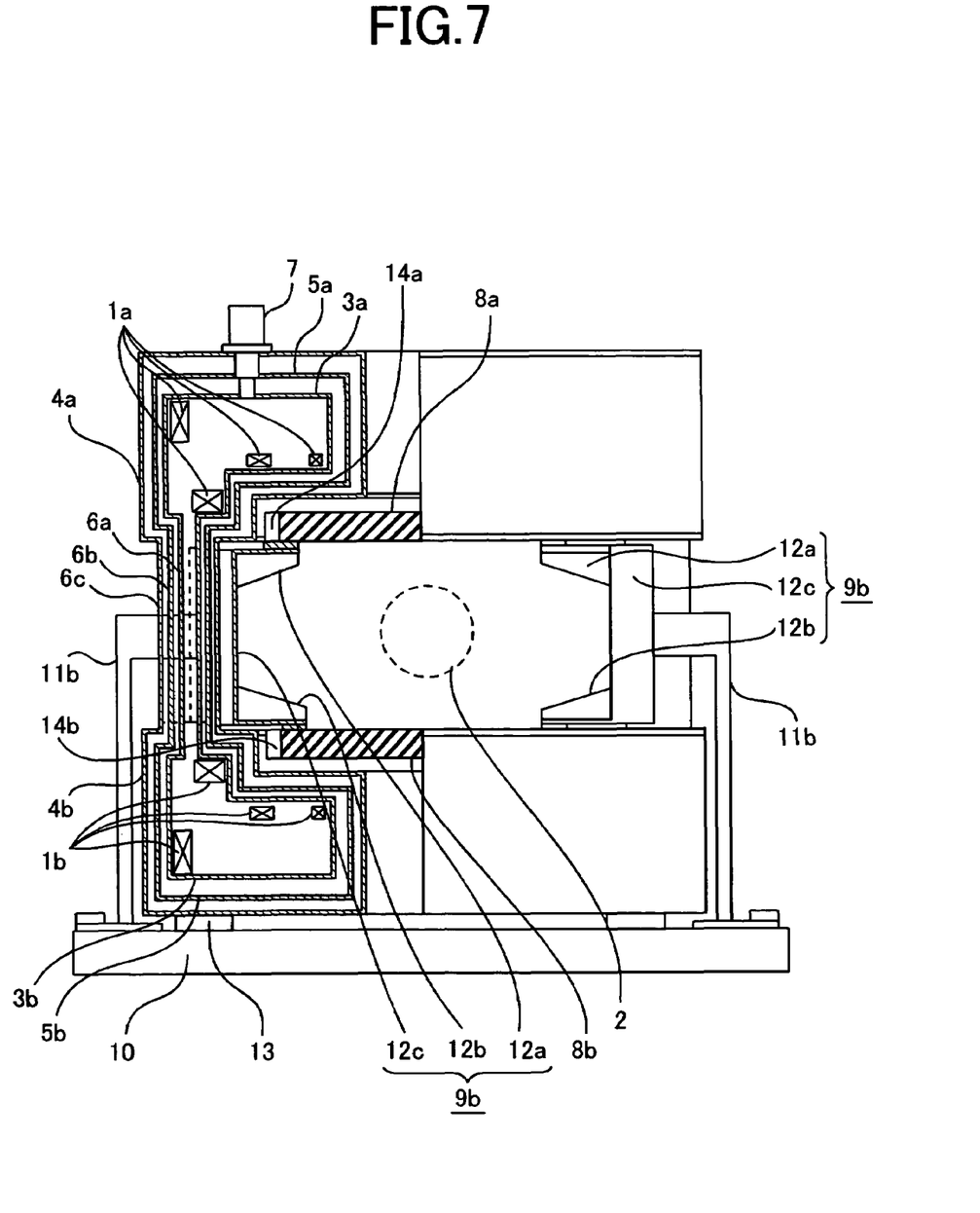
FIG. 7 is a partial cross-sectional view of a magnetic apparatus for explaining Embodiment 6.

FIG. 7 is a partial cross-sectional view of a magnetic apparatus for explaining Embodiment 6. In this Embodiment, stainless steel rings are fitted on the outer circumference of the gradient-magnetic-field coils. Here, although this Embodiment is explained as a modified example of Embodiment 2, it goes without saying that this can be applied to other Embodiments. Modified portions will be explained.

An upper stainless steel ring "14a" is fitted on the outer circumference of the upper gradient-magnetic-field coil 8a. In the same way, a lower stainless steel ring "14b" is fitted on the outer circumference of the lower gradient-magnetic-field coil 8b. The stainless steel rings 14a and 14b are non-magnetic.

By fitting stainless steel rings described above, the rigidity of the gradient-magnetic-field coils 8a and 8b is raised, as well as the mass thereof is increased. Thereby, if an electromagnetic force interacting between the both coils is not changed,.the gradient-magnetic-field coils 8a and 8b are unlikely to vibrate. Therefore, the vibrations of the gradient-magnetic-field coils 8a and 8b can be further decreased. As a result, the magnetic field-intensity fluctuation of the uniform static magnetic field generated by the superconductive coils 1a and 1b can be suppressed, so that the image quality of magnetic resonance images can be raised accordingly.

What is claimed is:

1. A magnetic apparatus, comprising:
    a superconductive electromagnet including pairs of superconductive coils for generating a uniform static magnetic field, a pair of vacuum containers each for housing one of the superconductive coils of each of the pairs thereof, and a vacuum-container-connecting member for connecting the pair of vacuum containers;
    a pair of gradient-magnetic-field coils for generating a gradient magnetic field having a gradient in a uniform static magnetic field region;
    a gradient-magnetic-field-coil-connecting member for connecting the pair of gradient-magnetic-field coils; and
    a supporting member connected, at a vibration neutral point, either to the gradient-magnetic-field-coil-connecting member, or to one of the gradient-magnetic-field coils, wherein the supporting member can be fixed to an installation base for the superconductive electromagnet.

2. A magnetic apparatus as recited in claim 1, wherein the supporting member is connected to a central portion of the gradient-magnetic-field-coil-connecting member and passes along the outside of the outmost edge of the vacuum containers, wherein the supporting member can be fixable to the base.

3. A magnetic apparatus as recited in claim 1, wherein the gradient magnetic-field-coil-connecting member comprises:
    a pair of truss portions each composed of a contact region contacting a respective one of the gradient-magnetic-field coils and a non-contact region jutting out from the outmost edge of the gradient-magnetic-field coils; and
    a pillar portion for connecting both the non-contact regions of the pair of truss portions.

4. A magnetic apparatus as recited in claim 3, wherein the supporting member is connected to a central portion of the pillar portion and passes along the outside of the outmost edge of the vacuum containers, wherein the supporting member can be fixable to the base.

5. A magnetic apparatus as recited in claim 3, wherein the supporting member is connected to one of the truss portions, and is disposed in collinear extension with the pillar portion.

6. A magnetic apparatus as recited in claim 1, wherein:
one of the pair of the vacuum containers is in annular form having a hollow, and
the supporting member is connected to one of the gradient-magnetic-field coils and passes through the hollow in the vacuum container neighboring the one of the gradient-magnetic-field coils, wherein the supporting member can be fixable to the base.

7. A magnetic apparatus as recited in claim 1, wherein the gradient-magnetic-field coils each comprise stainless steel rings fitted on the circumference thereof.

8. An installation method for the magnetic apparatus comprising:
a superconductive electromagnet including pairs of superconductive coils for generating a uniform static magnetic field, a pair of vacuum containers each for housing one of the superconductive coils of each of the pairs thereof, and a vacuum-container-connecting member for connecting the pair of vacuum containers;
a pair of gradient-magnetic-field coils for generating a gradient magnetic field having a gradient in a uniform static magnetic field region;
a gradient-magnetic-field-coil-connecting member for connecting the pair of gradient-magnetic-field coils; and
a supporting member connected, at a vibration neutral point, either to the gradient-magnetic-field-coil-connecting member, or to one of the gradient-magnetic-field coils, wherein the supporting member is fixed to an installation base for the superconductive electromagnet.

9. An installation method for the magnetic apparatus as recited in claim 8, wherein the supporting member is connected to a central portion of the gradient-magnetic-field-coil-connecting member and passes along the outside of the outmost edge of the vacuum containers, wherein the supporting member is fixable to the base.

10. An installation method for the magnetic apparatus as recited in claim 8, wherein:
one of the pair of the vacuum containers is in annular form having a hollow, and
the supporting member is connected to one of the gradient-magnetic-field coils and passes through the hollow in the vacuum container neighboring the one of the gradient-magnetic-field coils, wherein the supporting member is fixable to the base.

11. A magnetic resonance imaging diagnosis system, comprising:
a magnetic apparatus including a superconductive electromagnet for generating a uniform static magnetic field applied to a subject, and a pair of gradient-magnetic-field coils for generating a gradient magnetic field having a gradient in a uniform static magnetic field region;
a gradient-magnetic-field power supply connected to the gradient-magnetic-field coils;
high-frequency coils and a high-frequency-magnetic field generator for emitting high-frequency waves onto the subject, and receiving a nuclear magnetic resonance signal from the subject;
a computer for executing an imaging process based on the received nuclear magnetic resonance signal; and
a display unit for displaying image signals, processed by the computer, as a tomographic image; wherein the magnetic apparatus includes:
the superconductive electromagnet having pairs of superconductive coils for generating a uniform static magnetic field, a pair of vacuum containers for housing one of each pair of superconductive coils, and vacuum-container-connecting members for connecting the pair of vacuum containers;
the pair of gradient-magnetic-field coils for generating the gradient magnetic field having a gradient in a uniform static magnetic field region;
a gradient-magnetic-field-coil-connecting member for connecting the pair of gradient-magnetic-field coils; and
a supporting member connected, at a vibration neutral point, either to the gradient-magnetic-field-coil-connecting member, or to one of the gradient-magnetic-field coils, wherein the supporting member can be fixed to an installation base for the superconductive electromagnet.

12. A magnetic resonance imaging diagnosis system as recited in claim 11, wherein the supporting member is connected to a central portion of the gradient-magnetic-field-coil-connecting member
and passes along the outside of the outmost edge of the vacuum containers, wherein the supporting member can be fixable to the base.

13. A magnetic resonance imaging diagnosis system as recited in claim 11, wherein the gradient-magnetic-field-coil-connecting member comprises:
a pair of truss portions each composed of a contact region contacting a respective one of the gradient-magnetic-field coils and a non-contact region jutting out from the outmost edge of the gradient-magnetic-field coils; and
a pillar portion for connecting both the non-contact regions of the pair of truss portions.

14. A magnetic resonance imaging diagnosis system as recited in claim 13, wherein the supporting member is connected to a central portion of the pillar portion and passes along the outside of the outmost edge of the vacuum containers, wherein the supporting member can be fixable to the base.

15. A magnetic resonance imaging diagnosis system as recited in claim 13, wherein the supporting member is connected to one of the truss portions, and is disposed in collinear extension with the pillar portion.

16. A magnetic resonance imaging diagnosis system as recited in claim 11, wherein:
one of the pair of the vacuum containers is in annular form having a hollow, and
the supporting member is connected to one of the gradient-magnetic-field coils and passes through the hollow in the vacuum container neighboring the one of the gradient-magnetic-field coils, wherein the supporting member can be fixable to the base.

17. A magnetic resonance imaging diagnosis system as recited in claim 11, wherein the gradient-magnetic-field coils each comprise stainless steel rings fitted on the circumference thereof.

* * * * *